United States Patent [19]

Taur

[11] Patent Number: 4,509,991
[45] Date of Patent: Apr. 9, 1985

[54] SINGLE MASK PROCESS FOR FABRICATING CMOS STRUCTURE

[75] Inventor: Yuan Taur, Armonk, N.Y.

[73] Assignee: International Business Machines Corporation, Armonk, N.Y.

[21] Appl. No.: 539,516

[22] Filed: Oct. 6, 1983

[51] Int. Cl.³ .................. H01L 21/265; H01L 21/26; H01L 7/54
[52] U.S. Cl. .................. 148/1.5; 29/571; 29/576 B; 29/578; 148/187; 357/42; 357/91
[58] Field of Search .......... 148/1.5, 187; 29/571, 29/576 B, 578; 357/42, 91

[56] References Cited

U.S. PATENT DOCUMENTS

| 4,027,380 | 6/1977 | Deal et al. | 29/571 |
| 4,033,797 | 7/1977 | Dill et al. | 148/187 |
| 4,235,011 | 11/1980 | Butler et al. | 29/571 |
| 4,244,752 | 1/1981 | Henderson, Sr. et al. | 148/1.5 |
| 4,306,915 | 12/1981 | Shiba | 148/1.5 |
| 4,342,149 | 8/1982 | Jacobs et al. | 29/576 B |
| 4,366,613 | 1/1983 | Ogura et al. | 29/571 |
| 4,382,827 | 5/1983 | Romano-Moran et al. | 148/1.5 |
| 4,402,761 | 9/1984 | Feist | 148/1.5 |
| 4,435,896 | 3/1984 | Parrillo et al. | 29/571 |

OTHER PUBLICATIONS

Bassous et al., IBM-TDB, 25, (Dec. 1982), 3353.

Primary Examiner—Upendra Roy
Attorney, Agent, or Firm—John J. Goodwin

[57] ABSTRACT

A process for forming self-aligned complementary $n^+$ and $p^+$ source/drain regions in CMOS structures using a single resist pattern as a mask to form both the $n^+$ channel implant and then the $p^+$ channel implant. The resist pattern is formed using conventional lithography techniques to form an implant mask which covers the $p^+$ channel region while the $n^+$ source and drain regions are ion implanted. The resist mask is then used as a lift-off mask in order to cover the $n^+$ channel region while the $p^+$ source and drain regions are ion implanted.

7 Claims, 6 Drawing Figures

SINGLE MASK PROCESS FOR FABRICATING CMOS STRUCTURE

BACKGROUND OF THE INVENTION

1. Field of the Invention

This invention relates to a method for fabricating complementary FET structures, and more particularly to a method for implanting self-aligned n+ and p+ source and drains using only one lithography mask.

2. Description of the Prior Art

Various fabrication techniques for making complementary integrated circuits are known in the prior art. These techniques employ variations and combinations of doping implantation, masking and similar processes for defining and creating the device regions of the circuit.

Typical prior art references are as follows.

U.S. Pat. No. 3,759,763 issued Sept. 18, 1973 to Wang entitled METHOD OF PRODUCING LOW THRESHOLD COMPLEMENTARY INSULATED GATE FIELD EFFECT DEVICES describes a fabrication process for C-IGFET's including diffusion and etching steps of general interest. U.S. Pat. No. 4,027,380 issued June 7, 1977 to Deal et al and entitled COMPLEMENTARY INSULATED GATE FIELD EFFECT TRANSISTOR STRUCTURE AND PROCESS FOR FABRICATING THE STRUCTURE describes a process for fabricating a complementary insulated gate field effect transistor structure having complementary p-channel and n-channel devices in the same semiconductor substrate wherein the process for fabricating the structure incorporates oxide isolation of the active device regions, counterdoping of the p-well with impurities of opposite type to obtain a composite doping profile, reduction of $Q_{33}$ in the isolation oxide, doping of the gate and field oxides with a chlorine species and phosphorus doping of the polycrystalline silicon gates.

U.S. Pat. No. 4,244,752 issued Jan. 13, 1981 to Henderson, Sr. et al entitled SINGLE MASK METHOD OF FABRICATING COMPLEMENTARY INTEGRATED CIRCUITS describes a method of fabricating an integrated circuit having a plurality of different devices, which method employs a single mask to define the active areas of all such devices. A silicon oxide-silicon nitride layer is formed on the surface of a silicon wafer so as to define the location of subsequent oxide insulating layers which in turn actually define all the active areas of the circuit. Respective active areas for the different devices can then be formed by selective ion implantation. U.S. Pat. No. 4,144,101 issued Mar. 13, 1979 to Rideout and entitled PROCESS FOR PROVIDING SELF-ALIGNED DOPING REGIONS BY ION-IMPLANTATION AND LIFT-OFF is of interest in that it describes a technique wherein an undercut resist masking pattern is used as an ion implantation mask. More particularly, a process is described for providing ion-implanted regions in a substrate such as silicon beneath an existing layer such as silicon dioxide and being self-aligned to subsequently fabricated regions of said layer which includes providing a resist masking pattern above the existing layer wherein the resist masking pattern is undercut; ion-implanting impurities such as boron ions through the layer but not through the resist and portions of the layer beneath the resist; and depositing a layer of lift-off material such as aluminum on the existing layer and on the resist. This reference relates to a multiple masking process.

The described prior art references do not relate to a single mask process wherein a resist mask defines a first implant and then serves as a reverse mask for a second implant.

SUMMARY OF THE INVENTION

In silicon-gate CMOS fabrication, two ion implantation steps for source/drain doping of n-channel and p-channel FET's are normally required with two mask levels required for source/drain definition: one mask step to implant the n+ dopants while masking the p-channel areas, and the other to implant the p+ dopants while masking the n-channel areas.

An object of the present invention is to provide an n+/p+ implant process which requires only one lithography mask.

Another object of the present invention is to provide a one lithography mask process for n+/p+ source/drain implants wherein the implant doses may be independent of each other.

Still another object of the present invention is to provide a one lithography mask process for n+/p+ source/drain implants wherein the source/drain implants are self-aligned.

The foregoing and other objects, features, and advantages of the invention will be apparent from the following more particular description of the invention as illustrated in the accompanying drawings.

Disclosure of the Invention

Figure 1:
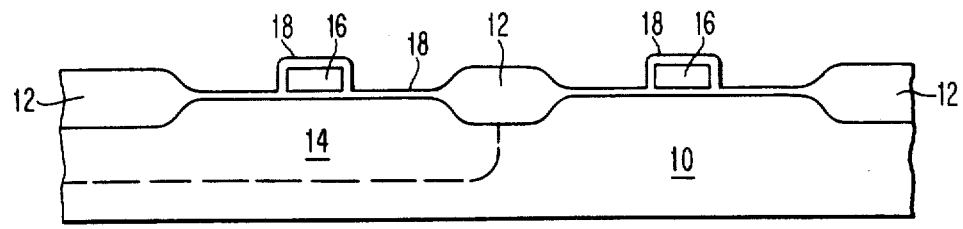
FIGS. 1, 2, 3, 4, 5 and 6 are cross-sectional views illustrating various stages of fabrication of CMOS structure according to the principles of the present invention.

Referring to FIG. 1, a p-type semiconductor substrate 10 is shown wherein recessed oxide sidewall isolation regions 12 have been deposited by conventional techniques. An n-well region 14 has been implanted and polysilicon gates 16 have been patterned and formed, both by well-known techniques. Both the polysilicon gates and the n-well diffusion are completely covered with either thermal deposition or chemical vapor deposition oxide layer 18.

Figure 2:
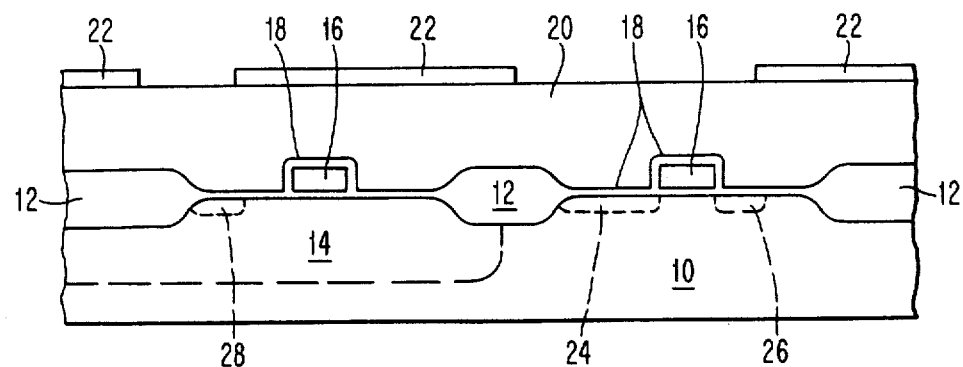

In FIG. 2, a layer of photoresist 20 is disposed over the entire structure and exposed through a suitable mask 22 using well-known photolithographic techniques. The exposed photoresist 20 is developed and etched to provide a region with an undercut, or negatively sloped profile as shown in FIG. 3.

Figure 3:
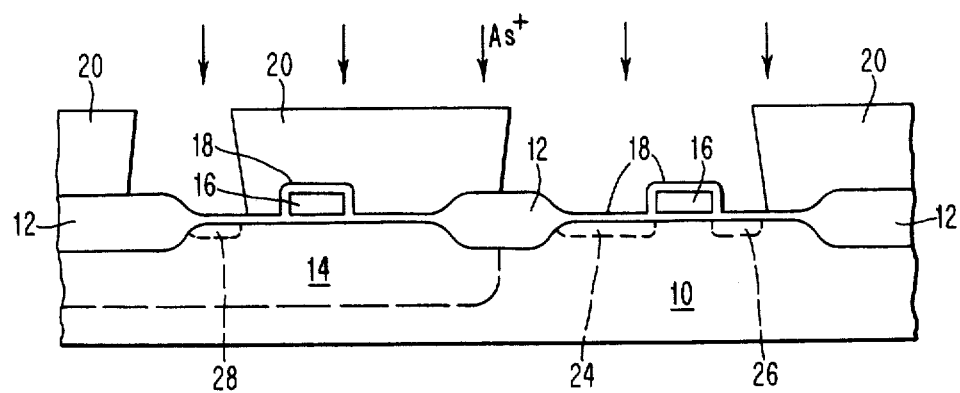

In FIG. 3, the remaining photoresist 20 with the negatively sloped profile is used as an implantation mask as dopants, such as As+ is used to provide the n+ implants, namely the n-channel source/drain 24, 26 and the ohmic contact 28 to the n-well 14.

Figure 4:
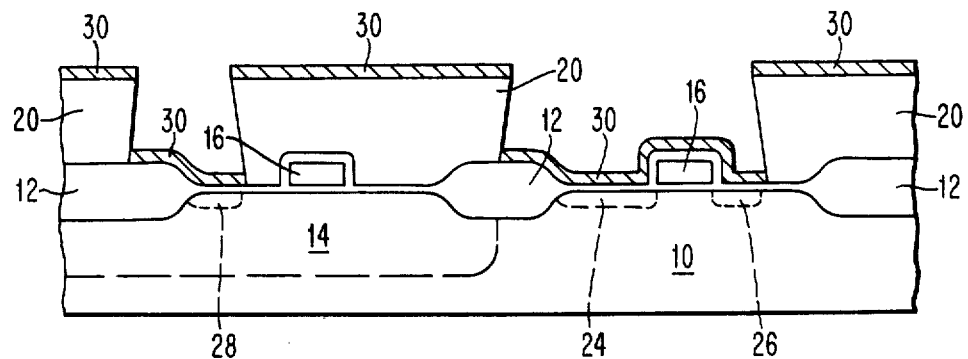
Figure 5:
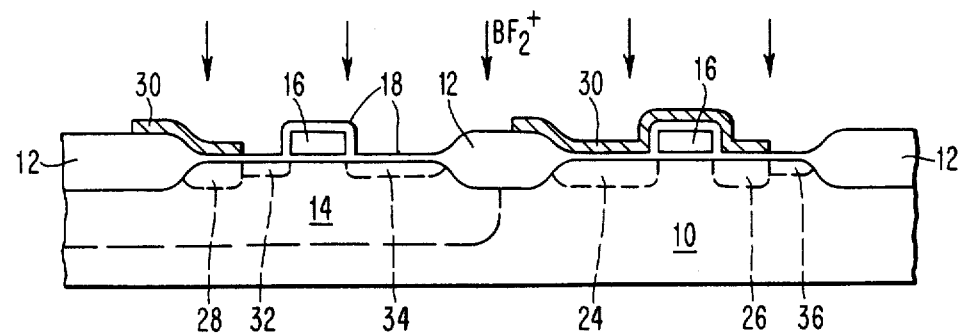

After the n+ implant, a silicon layer 30 is evaporated into the structure as shown in FIG. 4, and the resist 20 is then lifted-off as shown in FIG. 5 to leave the remaining silicon layers. A thermal anneal can be carried out at this point for an initial n+ drive-in.

Still referring to FIG. 5, a p+ ion implantation is performed, for example, using $BF_2^+$ as the dopant, to implant the p-channel source/drain 32/34 and the ohmic contact 36 to the substrate 10. Since the n+ regions are covered, there is no limitation on the strength of the p+ dose. It should be noted therefor, that the n-channel and the p-channel have been formed using only one lithographic masking step and wherein the implant doses are independent of each other. Furthermore, the n+ implants and the p+ implants are self-aligned.

Figure 6:
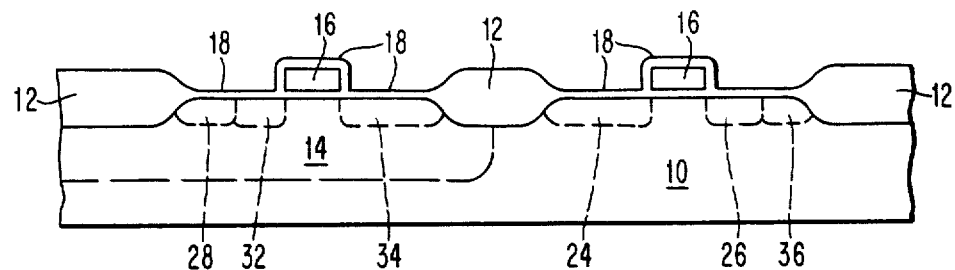

The silicon layer 30 is then stripped away in a selective etch plasma (i.e., $CF_4$ to $O_2$) which etches the silicon layer 30 but not the underlying oxide layer 18 to provide the structure illustrated in FIG. 6. In FIG. 6, the structure is completed with the standard drive-in, p-etch and oxide spacer definition steps to form silicide and butted contacts if needed.

The above described self-aligned n+/p+ process can be implemented quite generally in a variety of CMOS geometries. This includes n-well, p-well, and twin-tub structures. It can also be used in a configuration without butted contact in case a substrate bias is required. Furthermore, the metal film which blocks the second implant can be materials other than silicon, as long as it can be lifted off and selectively etched away after the process as long as the lift-off resist profile remains unchanged during the first high-dose implant. In this regard an implanter with wafer cooling system to keep the wafer below 100° C. for up to 1 $W/cm^2$ of ion beam power may be used. For a typical dose of $10^{16}/cm^2$ at ~100 KeV, this means that the implant can be carried out as fast as a few minutes per wafer without affecting the resist profile. Even if the resist had to be hardened (by plasma, deep UV, etc.) for the first implant, it is still possible to lift off the evaporated silicon in sulfuric-nitric acid afterwards.

In summary, the present invention provides a self-aligned technique for complementary n+/p+ implant in which the resist pattern is used twice: first as an implant mask; then as a lift-off mask to produce an opposite polarity pattern for the second implant. It should be very useful in CMOS process to save a lithography level while keeping the degree of freedom on the implant dose for p-channel source/drain areas.

The foregoing and other objects, features and advantages of the invention will be apparent from the following more particular description of the invention as illustrated in the accompanying drawings.

Having thus described my invention, what I claim as new, and desire to secure by Letters Patent is:

1. A process for implanting self-aligned source and drain regions in a complementary semiconductor structure of the type including a semiconductor substrate having recessed oxide isolation regions, defining at least one pair of device regions, a well region in said semiconductor substrate below one of said device regions, and gate electrodes in said device regions between said recessed oxide regions, said process comprising the steps of
    (a) first depositing a layer of photoresist on the surface of said substrate and exposing said photoresist layer through a single lighographic mask, and etching openings in said photoresist layer in accordance with said single lithographic mask such that source and drain regions of a first device region of said at least one pair of device regions are covered by a discrete layer of said photoresist and source and drain regions of a second device region of said at least one pair of device regions adjacent to said first device region are located under said opening in said photoresist layer,
    (b) implanting ions of a first conductivity type into said surface of said substrate through said opening in said photoresist layer to form ion implanted source and drain regions in said second device region, implantation of ions into said first device region being blocked by said photoresist layer,
    (c) depositing a layer of ion implantation blocking material over said photoresist layer and through said openings in said photoresist layer onto said source and drain regions of said second device region of said substrate,
    (d) removing said photoresist layer, thereby exposing said source and drain regions of said first device region of said substrate and maintaining said source and drain regions of said second device region covered by said ion implantation blocking material in a pattern which is the reverse of its first pattern of said photoresist layer in said single photolithographic masking step (a),
    (e) and implanting ions of a second conductivity type into said surface of said substrate for forming ion implanted source and drain regions in said first device region, ion implantation of said second device region being blocked by said layer of ion implantation blocking material such that said source/drain regions of said first device region and said source/drain regions of said second device region are directly self-aligned.

2. A process for implanting self-aligned source and drain regions in a complementary semiconductor structure according to claim 1 wherein said ions implanted in said step b are n+ conductivity ions to form n-channel source/drain regions and wherein said well is an n-well.

3. A process for implanting self-aligned source and drain regions in a complementary semiconductor structure according to claim 1 wherein said ions implanted in said step e are p+ conductivity ions to form p-channel source/drain regions.

4. A process for implanting self-aligned source and drain regions in a complementary semiconductor structure according to claim 1 wherein ions implanted in step b are also implanted through an opening in said resist layer adjacent to said covered first device region, said implanted ions forming a first conductivity ohmic contact to said well region.

5. A process for implanting self-aligned source and drain regions in a complementary semiconductor structure according to claim 1 wherein ions implanted in step e are also implanted into said substrate surface in an area adjacent to said second device region not covered by said ion implantation blocking material to form an ohmic contact to said substrate.

6. A process for implanting self-aligned source and drain regions in a complementary semiconductor structure according to claim 1 wherein said ions implanted in step b are n+ conductivity ions of arsenic or its equivalent, and wherein said ions implanted in step b are p+ conductivity ions of boron or its equivalent.

7. A process for implanting self-aligned source and drain regions in a complementary semiconductor structure according to claim 6 wherein said ion implantation blocking material of step c is silicon or its equivalent.

* * * * *